United States Patent [19]

Albert et al.

[11] Patent Number: 4,614,389

[45] Date of Patent: Sep. 30, 1986

[54] CIRCUIT BOARD ASSEMBLY FOR ACCURATE INSERTION

[75] Inventors: William G. Albert, Haverhill; Gerald G. Astell, Methuen; Anthony G. Favale; Leon H. Steiff, both of Peabody, all of Mass.

[73] Assignee: AT&T Bell Laboratories, Murray Hill, N.J.

[21] Appl. No.: 745,698

[22] Filed: Jun. 17, 1985

[51] Int. Cl.$^4$ ............................................. H01R 13/62
[52] U.S. Cl. .................................. 339/45 M; 339/65; 339/75 MP
[58] Field of Search ............... 339/45, 46, 91 R, 75 R, 339/75 M, 75 MP, 65

[56] References Cited

U.S. PATENT DOCUMENTS

| | | | |
|---|---|---|---|
| 3,008,113 | 11/1961 | Johnson | 339/65 |
| 3,335,386 | 8/1967 | Upton | 339/45 M |
| 3,476,258 | 11/1969 | Dorsett | 339/45 M |
| 3,764,857 | 10/1973 | Bartlett et al. | 339/75 MP |
| 4,233,646 | 11/1980 | Leung et al. | 339/45 M |
| 4,301,494 | 11/1981 | Jordan | 339/45 M |
| 4,417,778 | 11/1983 | Halvorsen et al. | 339/75 MP |
| 4,477,138 | 10/1984 | Andrews et al. | 339/75 MP |

Primary Examiner—Gil Weidenfeld
Assistant Examiner—David L. Pirlot
Attorney, Agent, or Firm—Joseph A. Cameron

[57] ABSTRACT

To provide accurate insertion of a circuit board into a high density socket in an equipment frame, a lever arrangement is mounted to the circuit board near its upper front edge on a pivot. Rotational force applied to a first lever arm causes a second arm to engage the frame, translating the rotational force to insertion force acting at the pivot. The combination of the acting insertion force and the insertion resisting force of the socket set up a moment couple. The moment couple tends to rotate the circuit board, forcing a reference surface on the board against a mating reference surface on the socket during insertion.

The lever arrangement also provides mechanical advantage for extraction and, by using the resilience of the board, latching. The lever also doubles as a faceplate to protect and beautify the equipment.

10 Claims, 5 Drawing Figures

CIRCUIT BOARD ASSEMBLY FOR ACCURATE INSERTION

BACKGROUND OF THE INVENTION

This invention is in the field of plug-in electronic circuit board assemblies, and more specifically, mechanical aids for plug-in board insertion and extraction.

Since the advent of the transistor, circuit boards which plug into a socket in electronic equipment have been common. They are often used to provide quick and easy access to circuit functions and for easy replacement for circuits which have failed. In addition, in some equipment, plug-in circuit boards are used to alter the function of the equipment, i.e., to provide options. In telecommunication multiplexing equipment, plug-in boards are also used to grow capacity. A channel bank, for example, may combine as many as 96 individual telephone channels onto one trunk, but the full capacity may not be needed for several years. The bank may be purchased with only enough plug-in channel units for immediate demand, with additional units ordered as the need arises.

In perhaps the most common type electrical connection for plug-in boards, a portion of the board along its leading edge forms the plug. Electrical contacts on the surface of the plug section of the board are connected to the board circuitry. When the circuit board is inserted into the equipment frame, the plug section of the board enters a socket, and spring-loaded contacts in the socket individually bear against the board contacts to complete all of the circuits.

With the remarkable progress of the past decade in the number of components that can be integrated on a single silicon chip, the amount of circuitry mounted on a circuit board has also increased many times. This naturally results in more and more connections needed between the board and the socket. While ten years ago one might expect twenty connections per board, more recent designs are apt to require over 150. Since the socket spring pressure required to make good contact is the same for each contact, the force required to insert a circuit board into an equipment frame socket increases directly with the number of contacts. It is therefore possible to require as much as 100 pounds of force to insert a board into a socket containing 198 contacts.

It is known in the art to use various latching levers to provide mechanical advantage to generate these high forces. What has turned a relatively simple problem in mechanical advantage into a much more difficult problem in accurate contact alignment, however, is the fact that the circuit boards themselves have shrunk while the number of contacts per board has increased. This has resulted in very close spacing between contacts. When boards and sockets are manufactured to economically achievable tolerances, it is all too likely that the contacts on the inserted board will not mate properly with the contacts in the socket. In fact, unless extreme care is used in inserting and extracting the board, open and short circuits and cross-connections can occur. Furthermore, socket contacts can be permanently bent out of shape by even slight vertical board movement during insertion or extraction. Needless to say, the high forces which must be overcome due to the large number of connections exacerbate the inaccuracy of the insertion process.

An object of this invention, however, is a circuit board assembly that includes a novel lever arrangement for smooth and accurate insertion even into a high density socket.

A second object is a circuit board assembly that provides smooth and easy extraction.

A third object is a circuit board assembly in which the lever arrangement is also a faceplate, and still another object is a circuit board assembly in which the faceplate lever also latches.

SUMMARY OF THE INVENTION

A circuit board assembly according to the invention comprises a circuit board having a contact section and a lever arrangement rotatably attached to the circuit board at a pivot point. The contact section includes an electrical contact field and a reference surface that is located a predetermined distance from the contact field. Application of force to a first arm of the lever arrangement rotates the lever. A second lever arm engages the frame so that the applied rotational force is translated into insertion force acting at the pivot point. The pivot point is located with respect to the contact field such that the insertion force forms a moment couple with the insertion resistance force. The moment couple tends to rotate the circuit board in a direction to maintain contact between the reference surface on the circuit board and a mating reference surface on the socket during insertion, thereby insuring accurate insertion.

The lever arrangement may also include a third arm for engaging the front surface of the frame to apply extraction force to the pivot point. A special commercially available socket that is not part of this invention, but was designed specifically for use therewith, insures straight withdrawal. The lever arrangement may be configured to serve as a faceplate and, by using the resilience of the board, to provide snap action latching.

DETAILED DESCRIPTION

Figure 1:
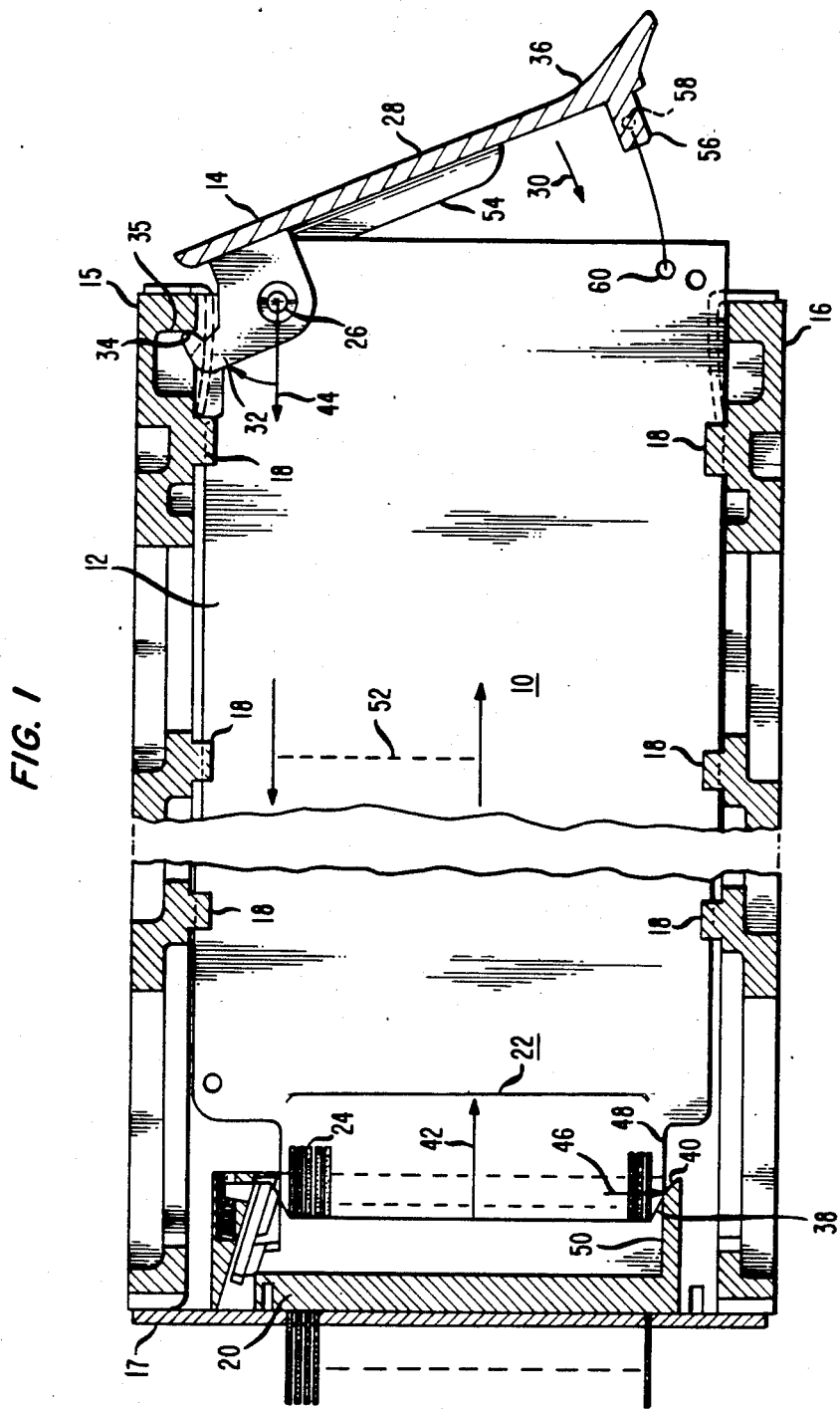
FIG. 1 is a cross-section view of a circuit board assembly according to the invention being inserted into an equipment frame.

The principles and operation of the invention will now be described with reference to FIG. 1, which illustrates a circuit board assembly constructed according to the invention being inserted into a socket in an equipment frame.

Circuit board assembly 10 comprises a circuit board 12 and a lever arrangement 14. Circuit board 12 would normally have mounted on it circuit components interconnected by conductive paths and could be produced by any of several well known methods. An equipment frame may include an upper shelf 15, a lower shelf 16 and a back 17 to support one or more circuit board assemblies. A channel to receive and guide the board may be formed by a series of lugs 18 attached to or integral with top and bottom shelves 15 and 16 respectively. A socket 20 may be mounted to frame back 17 to provide connections between the board and the rest of the universe.

For purposes of clarity, FIG. 1 is shown as a cross-section taken along a plane parallel to the board and slightly toward the viewer from the plane of the board.

Board 12 has a contact section 22, which is a narrowed section of the board intended for insertion into the socket. Contact section 22 has on its surfaces a field of electrical contacts 24 which connect to the components on the board and are intended to make connection to individual contacts in the socket.

Socket 20 includes a multiplicity of contacts which are spring-loaded and designed to electrically connect to contacts 24. The socket contacts are not shown in order to keep from cluttering up the drawing, but it will be understood that there will be a socket contact for every board contact.

Lever arrangement 14 is mounted to board 12 by a pivot 26. The pivot may simply be, for example, a shoulder rivet through a hole in board 12 peened to lever arrangement 14.

Lever 14 has a first arm 28 for application of a rotating force typically applied by a person's hand or fingers. Arrow 30 shows the direction of force applied for insertion. A second arm 32 is generally hook-shaped and has a bearing surface 34 at the end of the hook to make contact with a back surface 35 in the front edge of upper shelf 15.

Surface 35 may be created in any number of ways. It may be, for example, the front edge of a milled slot or the back surface of a separate shelf edge bar. If the shelf is injection molded of metal or plastic, surface 35 may be conveniently generated by a recess created to lighten the shelf and provide uniform heat transfer from the molded piece. At any rate, surface 35 needs to be a surface stiff enough to pry against.

During the insertion process, the circuit board assembly 10 is easily slid into the grooves formed by lugs 18. Lever arm 28 is raised to lower bearing surface 34 so that it can enter under the front edge of upper shelf 15. When force is applied to lever arm 28 in the general direction of arrow 30, lever arrangement 14 rotates in a clockwise direction, and bearing surface 34 makes contact with shelf surface 35 to apply insertion force to the board at pivot 26. Since the distance between bearing surface 34 and pivot 26 is shorter than the distance between pivot 26 and the point of application of the rotating force, typically at point 36, mechanical advantage is realized, generating a greater insertion force than the applied rotational force.

Before the board touches socket 20, gravity holds the board in contact with the upper surface of bottom shelf 16. As section 22 begins to enter socket 20, however, a chamfer 38 on the lower leading edge of board 12 makes contact with the chamfer 40 at the entrance to socket 20. Application of force to lever arrangement 14 causes the leading edge of board 12 to ride up over chamfer 40 and to enter the socket. This is the position illustrated in FIG. 1.

It may be noted that chamfers 38 and 40 on the board and socket respectively are not at the same angle. It has been found that resistance to insertion was higher when both chamfers were at 45 degrees. When the angle of chamfer 38 was reduced to 30 degrees to the horizontal, insertion was eased.

Further insertion of board 12 encounters the resistance of the spring loaded contacts of socket 20. Each of the springs, one for each contact, must be deflected against the spring tension to allow the board to be inserted. The resistance of all of these spring contacts may be considered for analysis purposes to be concentrated in the center of contact field 24. The result of all of these forces is shown as vector 42.

As further force is applied to lever arm 28 to overcome the spring contact resistance, this further force, augmented by mechanical advantage, acts at pivot 26 and is shown as vector 44. Because of the friction between surfaces 34 and 35, vector 44 may be considered to act horizontally. Since the insertion force represented by vector 44 and the resistance force represented by vector 42 are approximately equal but not directed at each other, they produce a moment couple 52 tending to rotate the board in a counterclockwise sense. This counterclockwise rotation manifests itself in a force 46 which forces the contact section 22 downward to keep the bottom edge 48 of contact section 22 in constant contact with the inner surface 50 of the bottom of socket 20. To avoid vertical force on the spring contacts of socket 20, which could damage the contacts, the board and socket are dimensioned such that chamfers 38 and 40 have passed each other, and surfaces 48 and 50 are in contact before the board touches the spring contacts.

By keeping surfaces 48 and 50 in contact during insertion, moment couple 52 not only insures straight insertion, but provides the means for accurate alignment between mating contacts as well. Edge 48 becomes a reference surface. In the manufacturing of board 12, distances between the individual contacts of field 24 and surface 48 are tightly controlled. In like manner, socket surface 50 becomes a reference surface; the distances between the individual spring contacts in socket 20 and socket surface 50 are also tightly controlled. When reference surfaces 48 and 50 are pressed together, therefore, manufacturing tolerances for the location of mating electrical contacts on the board and the socket are referenced to effectively the same datum plane. Moment couple 52 thus insures accurate contact alignment as well as straight insertion, to provide a truly accurate insertion process.

While it is customary to mount a back plane socket such as socket 20 to the back of an equipment frame in a "floating" manner so that the socket can align itself to the board, it has been found better in the application of this invention to mount socket 20 rigidly to back 17. The inaccuracy due to the socket floating is thereby eliminated.

Just as the very large number of spring contacts creates a large resistive force that must be overcome to insert the board into the socket, so too does it create a considerable force to be overcome to extract the board. Lever arrangement 14 can also help in the process, as will be explained in reference to FIG. 2.

For aid in extraction, the upper end 62 of lever arm 28 can conveniently extend above the bottom edge of upper shelf 15. In addition, lower end 64 of arm 28 can extend at an angle inclined away from the board. The inclination of lower end 64 provides space for a craftsperson's finger to be inserted to start the extraction process. As extracting force is applied to lower end 64 in the direction of arrow 66, upper end 62 bears against upper shelf 15. Alternatively, as will be explained later, in the embodiment illustrated in FIGS. 1 and 2 a designation strip 68 is attached to the front edge of upper shelf 15, and upper end 62 of lever arm 28 bears against the designation strip. The designation strip-upper shelf thereby becomes a fulcrum at the contact point 70 for lever arm 28 to pry board 12 out of socket 20; rotating force applied to end 64 of arm 28 is translated into extraction force operating on pivot point 26 shown in FIG. 2 by vector 72. Since the distance between end 64 and contact point 70, the moment arm for the applied rotation force, is much larger than the distance between pivot point 26 and contact point 70, the moment arm for the extraction force, considerable mechanical advantage is generated. A relatively small force applied by finger to lever arm 64 generates a large extraction force.

As has been shown, lever arrangement 14 generates a moment couple during insertion, which is used according to the invention to insure accurate insertion. So too, lever arrangement 14 generates a moment coupled during extraction. The combined friction forces of all of the spring contacts in the socket acting on the contact section of the board may be represented by vector 74. Together with vector 72, vector 74 forms a moment couple 76 tending to rotate the board in a clockwise sense. Since the front edge of the board is held by bottom shelf 16 and the friction between lever arm 28 and designation strip 68, the moment couple is manifested by a force 78 tending to lift the contact section of the board in the socket. Force 78, if unrestricted, could cause damaging short circuits and cross connections during the extraction process, and even bend the socket contacts.

Figure 2:
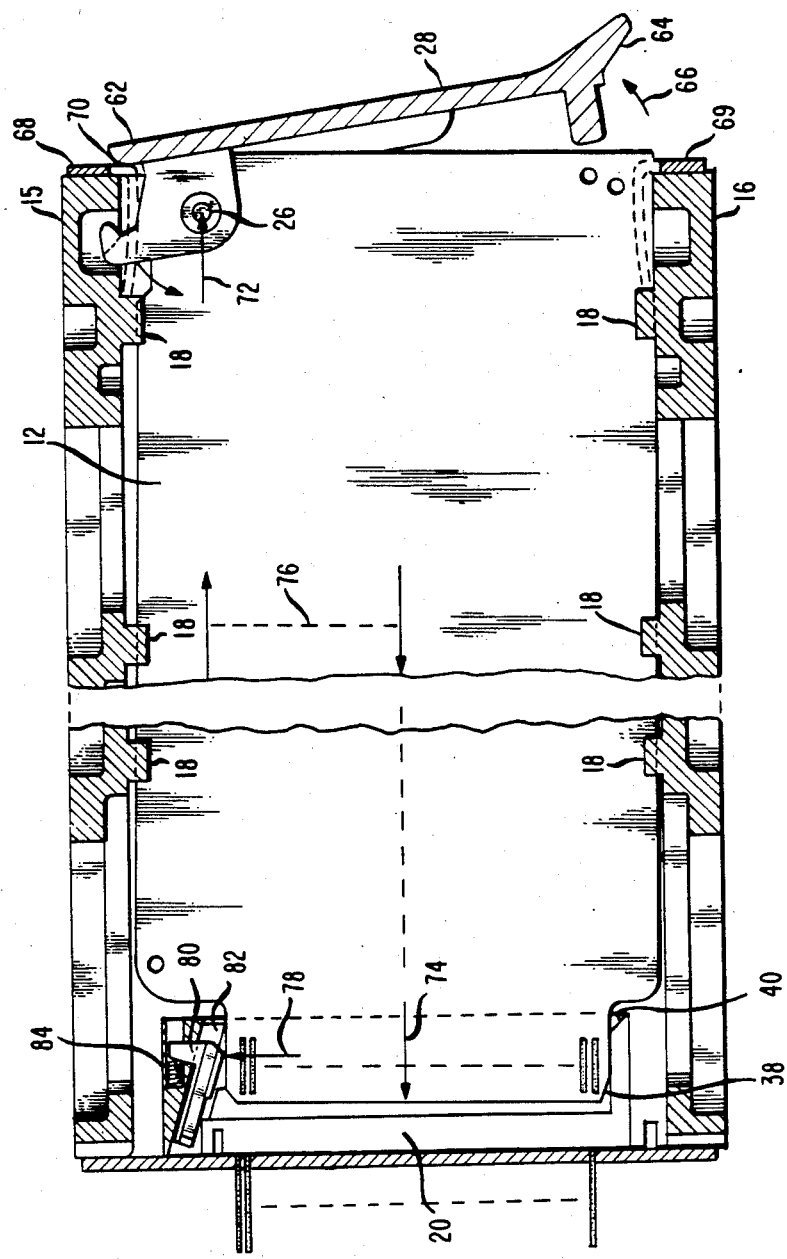
FIG. 2 is a cross-section view of the circuit board assembly and frame of FIG. 1 during the extraction process.

To overcome the rotational tendency of the extraction moment couple, the "double density" socket manufactured by AMP Incorporated may be used as socket 20. The "double density" socket, as shown in FIG. 2, has a wedge 80 that is held captive but free to move in recess 82 in the upper part of the socket. Recess 82 is inclined at a low angle rising toward the rear of the socket. A spring 84, of relatively light force, pushes wedge 80 toward the front of socket 20, while the inclination of recess 82 pushes wedge 80 downward as well.

When board 12 is inserted into the socket, wedge 80 easily moves against the low spring force to allow the contact section of the board to fully enter the socket. The amount of insertion force added is therefore insignificant. With board 12 fully in socket 20, spring 84 pushes wedge 80 down against the top of the board contact section.

When board 12 is extracted, however, upward movement due to force 78 is resisted by the friction of wedge 80 in recess 82. Because of the low angle of the wedge, most of force 78 acts to increase the friction, and very little to move the wedge. As a result, wedge 80 does not move, and board 12 is extracted straight out without rising to cause problems.

Pivot 26 is therefore positioned according to the invention to set up desirable insertion moment couple 52 to insure accurate insertion. Unwanted moment couple 76 set up upon extraction because of the position of pivot 26, however, is rendered harmless because of the wedge feature of socket 20.

In order to set up insertion moment couple 52, it is only necessary that pivot point 26 be higher on the board than the effective center of the insertion resistance; assuming that the socket has contacts uniformly spaced along its entire vertical length, that center may be considered to be the center of the contact section of the board. Since the moment arm is very long, however, for the application of force 46, which insures the accurate insertion, it is well to maximize moment couple 52. This may be accomplished by locating pivot point 26 as high on the board as practical and contact section 22 as low as practical.

The use of a designation strip 68 on upper shelf 15 and a similar strip 69 on bottom shelf 16 are a well known device for customizing more or less universal shelves. Shelves 15 and 16 may have many channels for receiving circuit boards set as close together as is practical for the manufacture of the shelves. The channels might be defined by sets of lugs 18, as shown in FIGS. 1 and 2, or they may be, for example, continuous channels. The optimum spacing between circuit boards for any particular piece of equipment, however, may vary considerably depending upon the number of boards needed, the physical size of components mounted on the boards, the size of the socket and the heat generated by the circuits.

Strips 68 and 69 are used to limit access to only the channels selected by the designer for the particular piece of equipment. The strips may be folded pieces of material such as sheet metal or plastic which are attached to the shelves, extending along the front edges of the shelves and into the opening between shelves, restricting the opening. Slots in the strips allow boards to be inserted only into designated channels. The strips may conveniently be labelled, designating which particular circuit boards belong in each slot, hence the common terminology "designation strip." Since a single shelf often serves as top shelf for one piece of equipment and a bottom shelf for another piece mounted directly above it, a single designation strip may fold over both the top and the bottom of the shelf. In such case, since the pieces of equipment may not be identical, the slots on the top and bottom of the strip may be in very different locations.

Figure 3:
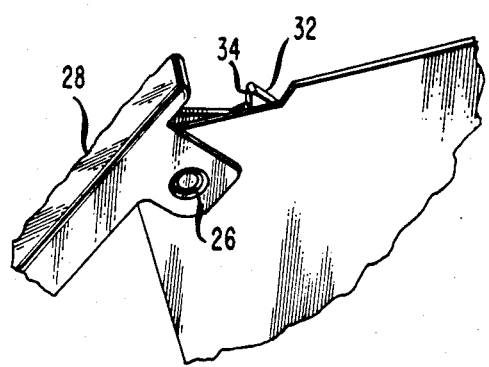
FIG. 3 is a detail of a feature to limit the rotational travel of a lever arrangement useful in practicing the invention.
Figure 4:
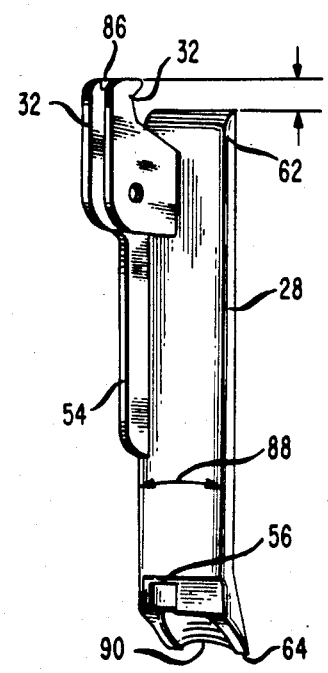
FIG. 4 is a view of the back side of a lever arrangement useful in practicing the invention.

The extension of lever arm 28 to bear upon the upper shelf or designation strip introduces the possibility that arm 28 will be rotated so far in a counterclockwise direction that upper end 62 will slide under shelf 15 and designation strip 68. If that were to happen, application of clockwise rotation force, as is usual to insert the board, could easily damage the board assembly or the equipment frame. To limit the travel of lever arm 28, therefore, lever arm 32 may include a step, as shown in FIG. 3, so that the end containing bearing section 34 is thicker and extends over the top edge of the board. The step is located such that when the step is bearing against the top edge of the board, arm 32 slides under shelf 15, but end 62 of lever arm 28 does not. An alternate construction is shown in FIG. 4 in which there are two arms 32 that straddle board 12. A bridge 86, between the two arms 32, restricts the rotation of arm 28 so that end 62 will not slip under upper shelf 15. With travel of lever arm 32 thus restricted, since designation strip 68 projects into the space below shelf 15, it may have to be slotted to receive the lever arms 32 as well as the board.

When a piece of electronic equipment comprises several circuit boards mounted side by side in an equipment frame, protection is needed both for the equipment and for people who might come in contact with it. Typically, the protection takes the form either of doors, which must be opened to access the equipment, or of individual faceplates, which mount on the front edge of each board and together form a protective surface. It is a further feature of this invention that lever arrangement 14 can also serve as a faceplate.

FIG. 4 shows the back side of one such lever arrangement. When the board is in place, lever arm 28 lies flush against the front edge of the board. It is a simple matter, therefore, to make width 88 of lever arm 28 large enough to fill the space between boards. Circuit identifying information can be printed on the front of the faceplate lever.

Also shown on the faceplate-lever embodiment of FIG. 4 is an oval shaped recess 90 on the back side of end 64. Recess 90 conveniently nests a craftsperson's finger at the center of the lever so that only one lever is lifted to remove a board. This is particularly useful when there are several narrow abutting faceplate-levers.

Figure 5:
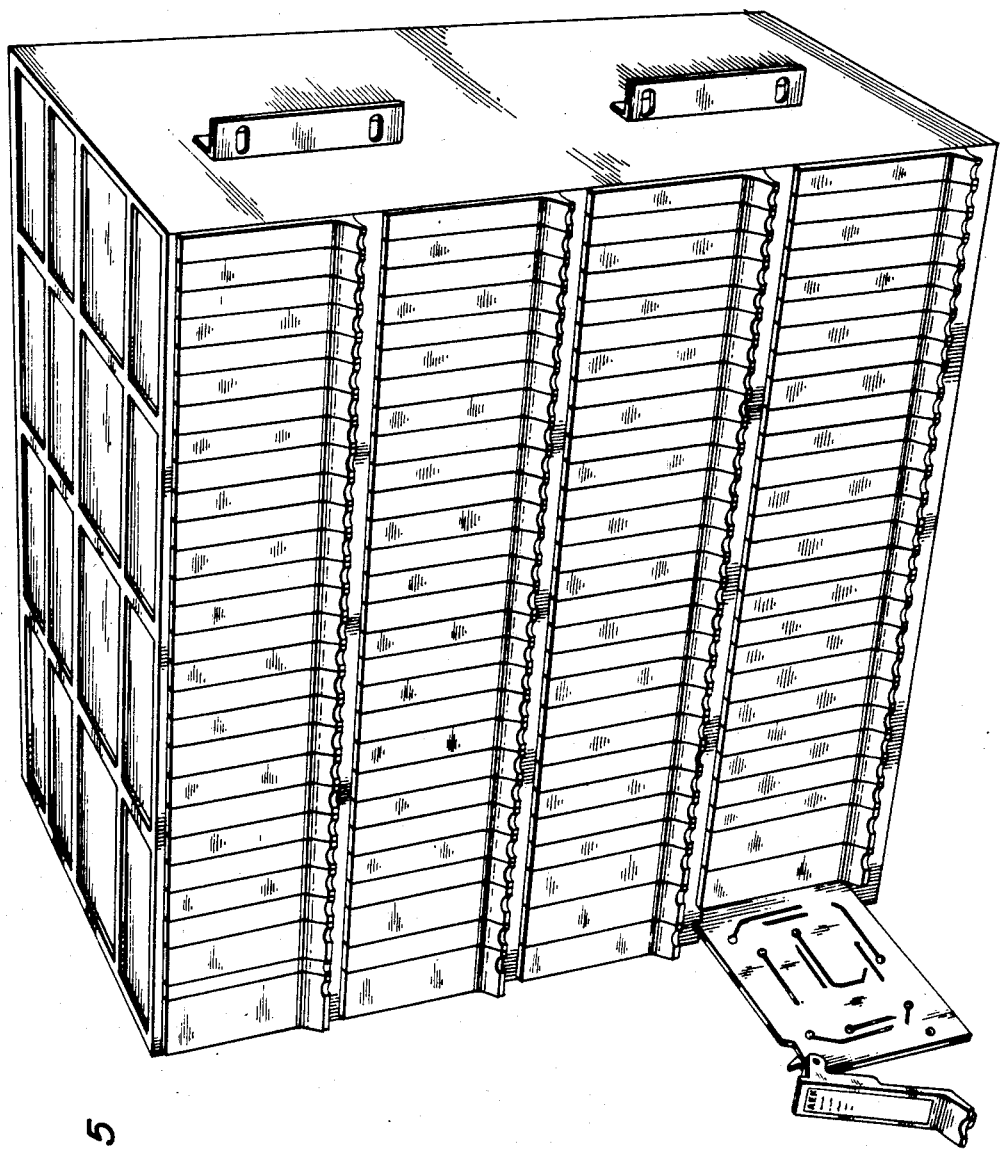
FIG. 5 is a view of one circuit board assembly being inserted into an equipment frame containing several other circuit board assemblies.

FIG. 5 shows a number of board assemblies according to the invention in place with the faceplate lever arrangements forming a smooth, protective and attractive shield.

It is useful to provide some kind of latch arrangement to keep lever arm 28 tight against board 12 when the board is in place in the frame. This not only reduces chances that someone's clothing might catch on the lower lever, but it also provides additional assurance that the board is locked in place both during shipping and in operation. The embodiments shown in FIGS. 1, 4 and 5 readily accomplish such latching.

In reference to FIG. 1, it will be noted that lever arm 28 has two extensions projecting inward. Extension 54 is located to pass just behind the board, and extension 56 to pass just in front of the board, as arm 28 is pushed toward the board. On the hidden side of extension 56, shown as a dotted circle, is a small boss 58. When arm 28 is flush against board 12, boss 58 rests in a hole 60 in the board. In order for boss 58 to enter or leave hole 60, however, the portion of the board between the bottom edge of extension 54 and boss 58 must flex. The amount of latching force can therefore be controlled by the height of boss 58 and the length of extension 54. It has been found that for a fiber glass board 0.060 inches thick, a boss extending 0.045 inches from the back surface of extension 56 and a flexure length of 1 inch between the end of extension 54 and boss 58 provide an effective latching force.

We have thus described a circuit board assembly which insures easy and accurate insertion, even with very large numbers of closely spaced contacts. Insertion is straight, and mating board and socket contacts are properly aligned upon insertion and extraction. The assemblies may also provide latching to keep the levers down and the boards in place, mechanical advantage in extracting the boards and faceplates to protect and identify the boards and give an attractive appearance to the equipment.

Many features of particular board assemblies have been described herein. It will be recognized, however, by those skilled in the art that it is possible to build many variations thereof and to omit many of the features without departing from either the spirit or the scope of the invention.

What is claimed is:

1. A system for accurately inserting a circuit board into a socket in an equipment frame comprising:
    a socket in said equipment frame said socket having a vertical slot;
    a circuit board having a contact section including an electrical contact field for insertion into said socket slot;
    upper and lower horizontal channels in said equipment frame for holding said circuit board in a vertical plane and guiding said circuit board toward said socket slot,
    said lower channel having a support surface for supporting the bottom edge of said circuit board as it is being guided toward said slot;
    a lever arrangement rotatably attached to said circuit board at a pivot point,
    said lever arrangement having a first arm for application of a force to rotate said lever, and
    a second arm for engaging said frame to translate lever rotation force of a first sense applied to said first arm into insertion force active at said pivot point to overcome insertion resistance force applied to said contact section by said socket;

CHARACTERIZED IN THAT the lower end of said slot is fixed a first predetermined height above said support surface to form a socket reference surface;
the bottom edge surface of said contact section is a second predetermined height above the bottom edge surface of said board to form a board reference surface;
said first predetermined height is at least as large as said second predetermined height; and
said pivot point is located with respect to said contact section such that said insertion force forms a moment couple with said insertion resistance force
said moment couple holding said board reference surface down against said socket reference surface during insertion.

2. A system, as in claim 1, wherein said socket slot has a movable upper end for accommodating contact sections of differing heights.

3. A circuit board assembly as in claim 1 wherein said pivot point is located in the upper front corner of said board.

4. A system, as in claim 3, wherein said slot has a chamfer at the front of its lower end, and said contact section has a chamfer on its lower leading edge, said contact section chamfer forming a more acute angle with the horizontal than said slot chamfer.

5. A circuit board assembly as in claim 3 wherein
said lever arrangement has a third arm contiguous with said first arm and extending opposite said second arm for engaging said frame to translate lever rotation force of a second sense into extraction force active at said pivot point to extract said contact section from said socket.

6. A circuit board assembly as in claim 5 wherein
said first arm has an oval shaped recess on the back side of its free end for guiding a person's finger to a single lever arrangement during extraction.

7. A circuit board assembly as in claim 5 wherein
said second arm has a thicker section including said outer extremity of substantially greater thickness than the remainder of said second arm,
said thicker section contacting said board to limit the rotation of said lever arrangement in said second sense to prevent said third arm from entering said equipment frame.

8. A circuit board assembly as in claim 7 wherein
said lever arrangement has a fourth arm similar to said second arm,
said fourth arm is located parallel to and on the opposite side of said board from said second arm, said second and fourth arms being joined by said thicker section.

9. A circuit board assembly as in claim 5 wherein said first arm with its free end rotated fully downward lies along the front edge of said board, and said first and third arms are elongated in a plane perpendicular to said board to form a face plate for filing the space between adjacent boards at said front edge and for carrying information about said assembly.

10. A circuit board assembly as in claim 9 wherein said first arm has first and second rear extensions extending behind and perpendicular to the plane of said first arm straddling the front edge of said board, said first extension being coplanar with said second arm and extending from near said pivot point toward the free end of said first arm and ending at an intermediate point, said second extension located closer to said free end of said first arm than said intermediate point and having a projecting boss, said board having a hole near its front edge to receive said boss, the portion of said board between said intermediate point and said hole requiring flexing for said boss to pass into and out of said hole, whereby latching action is provided to latch said first arm with its free end fully rotated downward.

* * * * *